United States Patent [19]

Ogura et al.

[11] Patent Number: 4,959,703
[45] Date of Patent: Sep. 25, 1990

[54] TURN-ON/OFF DRIVING TECHNIQUE FOR INSULATED GATE THYRISTOR

[75] Inventors: Tsuneo Ogura, Kamakura; Akio Nakagawa, Hiratsuka, both of Japan

[73] Assignee: Kabushiki Kaisha Toshiba, Kawasaki, Japan

[21] Appl. No.: 373,279

[22] Filed: Jun. 28, 1989

Related U.S. Application Data

[62] Division of Ser. No. 161,095, Feb. 26, 1988.

[30] Foreign Application Priority Data

Feb. 26, 1987 [JP] Japan .................... 62-41307
Feb. 26, 1987 [JP] Japan .................... 62-41308
Feb. 26, 1987 [JP] Japan .................... 62-41316
Dec. 28, 1987 [JP] Japan .................... 62-330064

[51] Int. Cl.$^5$ ........................... H01L 29/74
[52] U.S. Cl. ........................ 357/38; 357/23.4; 357/43
[58] Field of Search ............... 357/38, 37, 39, 23.4, 357/43

[56] References Cited

U.S. PATENT DOCUMENTS

| 4,331,969 | 5/1982 | Baliga | 357/43 |
|---|---|---|---|
| 4,466,010 | 8/1984 | Patalong | 357/38 |
| 4,604,638 | 8/1986 | Matsuda | 357/23.4 |
| 4,691,223 | 9/1987 | Murakami et al. | 357/38 |
| 4,760,431 | 7/1988 | Nakagawa et al. | 357/23.4 |
| 4,825,274 | 4/1989 | Higuchi et al. | 357/43 |
| 4,901,131 | 2/1990 | Takahashi | 357/43 |
| 4,912,541 | 3/1990 | Baliga et al. | 357/38 |

FOREIGN PATENT DOCUMENTS 54-37589 3/1979 Japan .................... 357/386
58-66356 4/1983 Japan .................... 357/386

OTHER PUBLICATIONS

"Comparison of High Voltage Devices for Power ICs", R. Jayaraman et al., IEDM 84, pp. 258-261, 10.1.

Primary Examiner—Andrew J. James
Assistant Examiner—Don Monin
Attorney, Agent, or Firm—Oblon, Spivak, McClelland, Maier & Neustadt

[57] ABSTRACT

A turn-on/off driving technique for an insulated gate thyristor which has a first gate electrode insulatively provided above a first base layer and fuctioning as a gate of MOSFET, and a second gate electrode formed on the second base layer. To drive the turn-on of the thyristor, a first voltage for rendering the MOSFET conductive is applied to the first gate electrode, while substantially simultaneously a second voltage for producing forward biasing between the second base layer and a second emitter layer is applied to the second gate electrode. To turn-off drive the thyristor, a third voltage for reverse biasing between the second emitter layer and the second base layer to stop the operation of the thyristor is applied to the second gate, while the MOSFET is kept conductive. The thyristor starts turning off in response to the voltage application. At this time, charge carriers exhausted from the second emitter layer are allowed to flow into the first base layer through the channel region of the MOSFET, thereby suppressing the local concentration of the turn-off current in the thyristor.

12 Claims, 11 Drawing Sheets

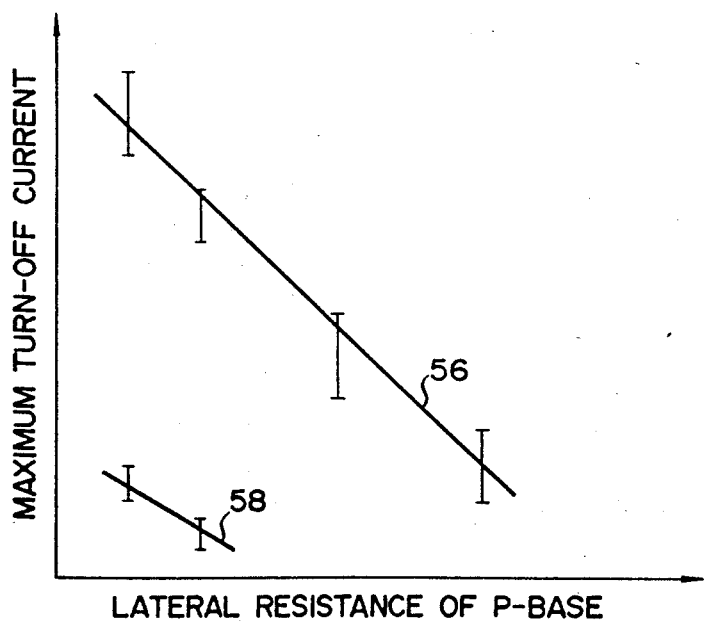
F I G. 7
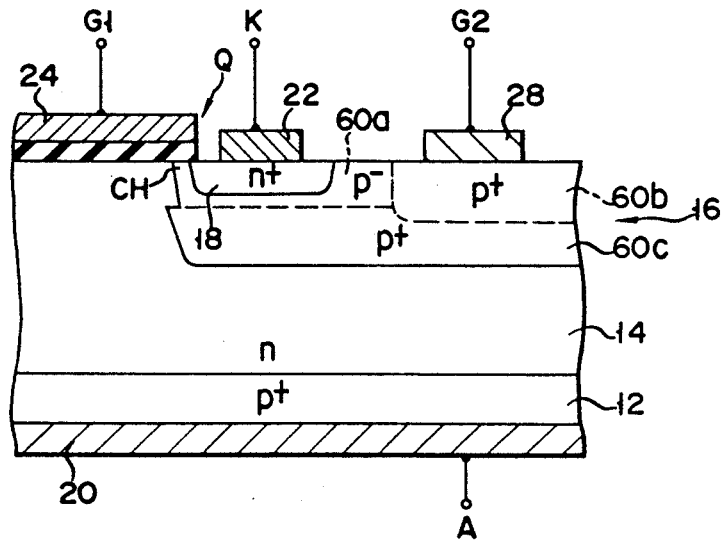
F I G. 8

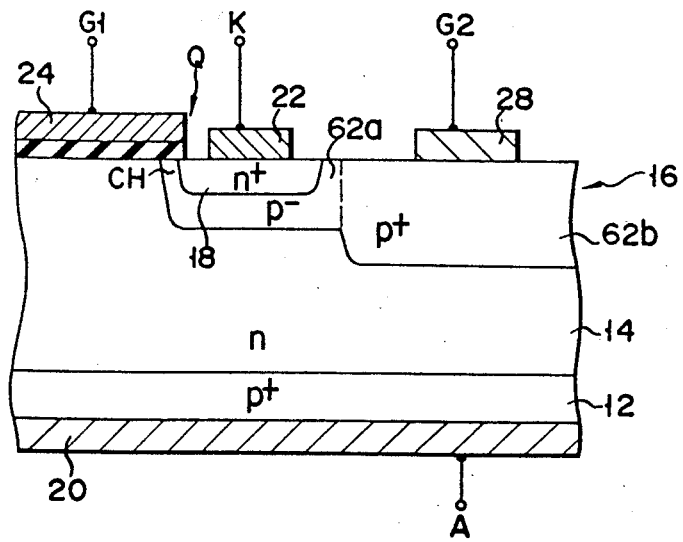
F I G. 11
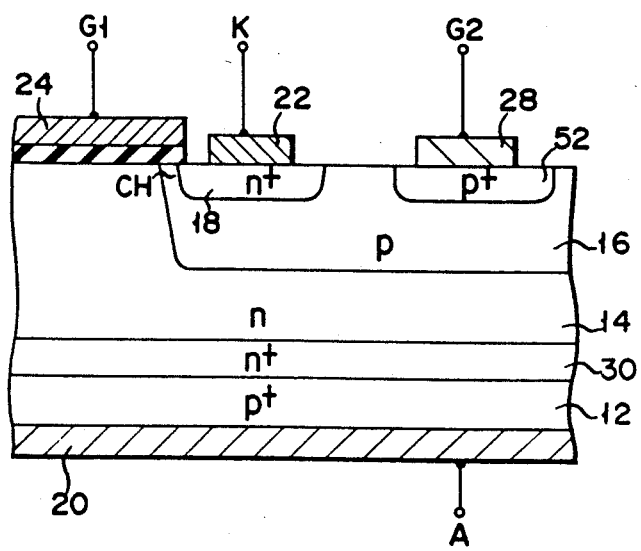
F I G. 12

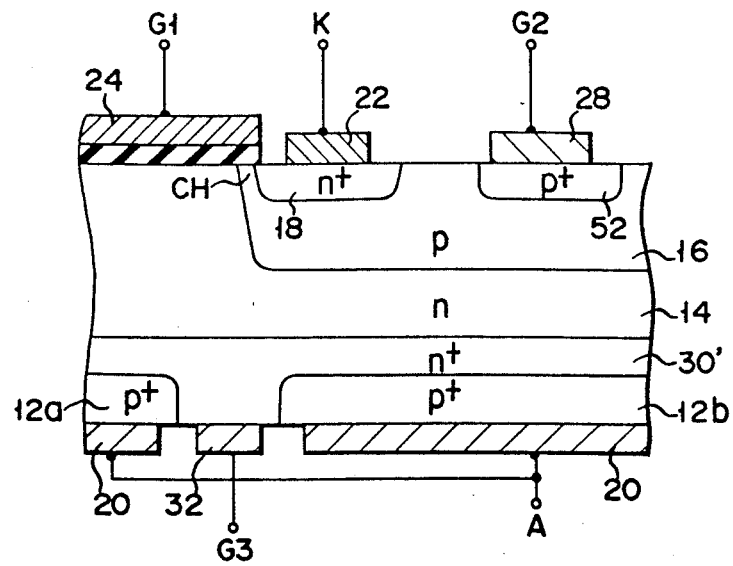
F I G. 13
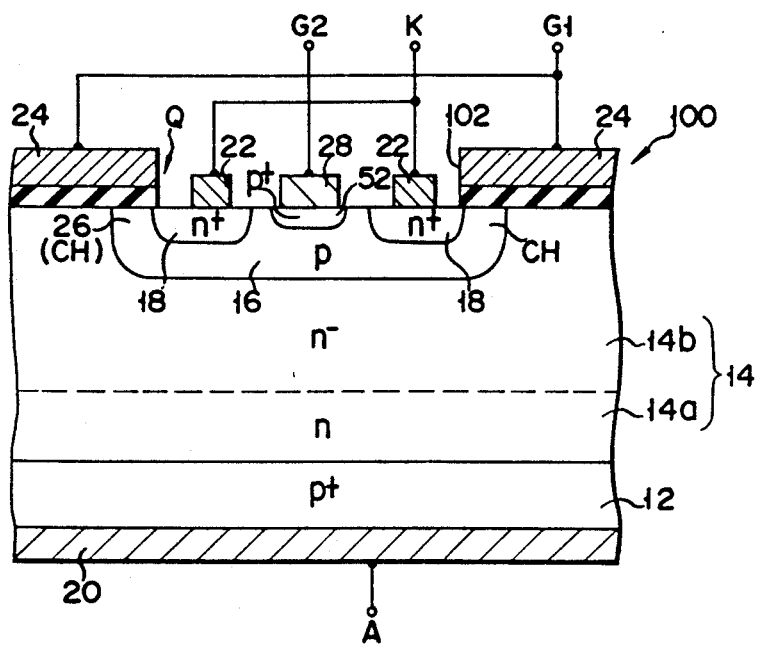
F I G. 14

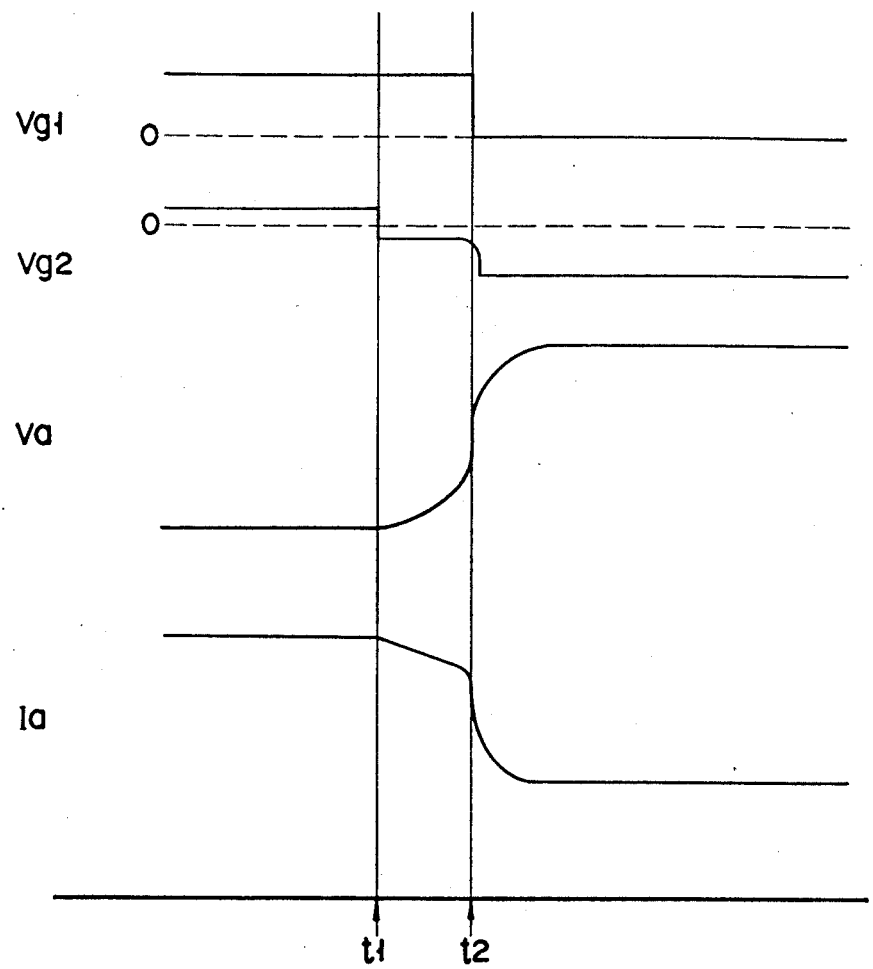
F I G. 15

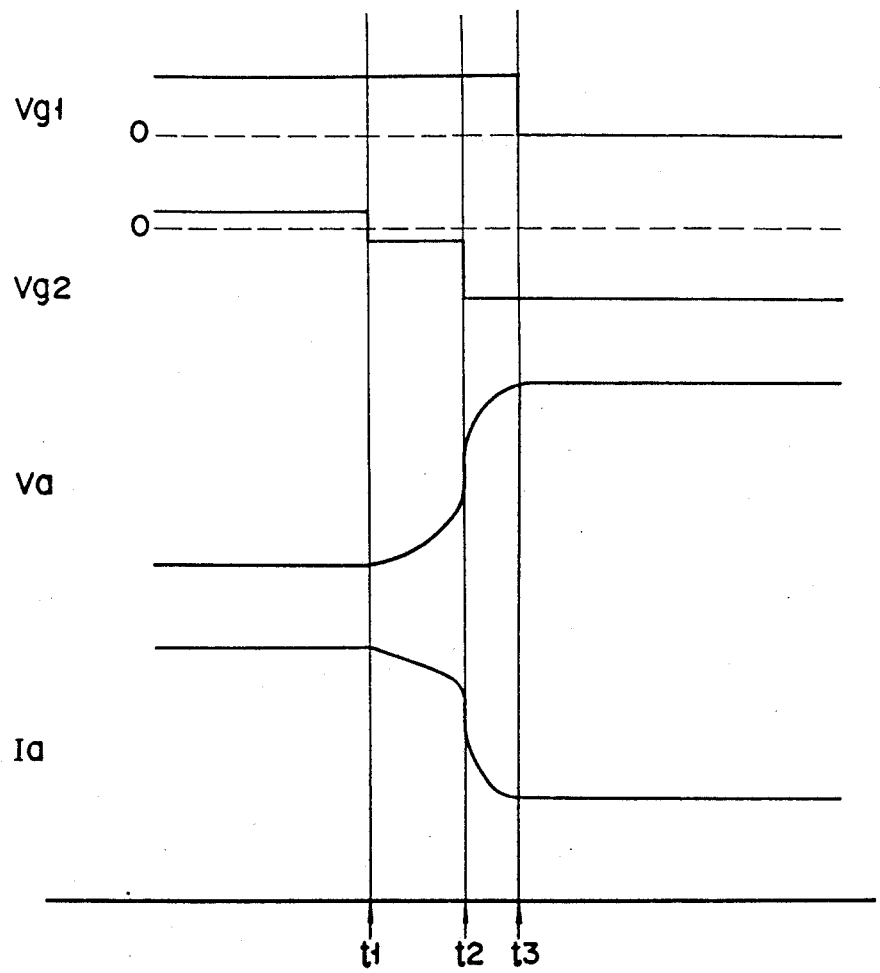
F I G. 16

TURN-ON/OFF DRIVING TECHNIQUE FOR INSULATED GATE THYRISTOR

This is a division, of application Ser. No. 07/161,095, filed on Feb. 26, 1988.

BACKGROUND OF THE INVENTION

1. Field of the Invention:

The present invention relates to insulated gate thyristor devices and, more particularly, to a turn-on/off driving technique for an insulated gate thyristor.

2. Description of the related art:

Thyristors are semiconductor switching elements which can be shifted from a nonconductive state in which current does not flow through a thyristor device to a conductive state in which a current flows in response to a gate control signal applied to its gate electrode. In order to improve the switching characteristics of the thyristors, it is important to decrease energy loss of the thyristors at switching time and increase the maximum capability of the turn-on/off current. The improvement in the turn-on capability depends upon the allowable limit of the rising rate of a turn-on current (i.e., the rising rate of a critical current, known as "di/dt rating"). When a thyristor is driven to turn on, if an abrupt turn-on current exceeding the di/dt rating flows into the thyristor, a local current concentration occurs in its turn-on region. This leads to the breakdown of the device. Improvements in the turn-off capability of the device are desired to fundamentally prevent the turn-off current from locally concentrating to substantially uniformly stop the turn-off current over the entire turn-off region of the device.

In order to improve di/dt rating of thyristors, a thyristor having a MOS gate structure is known, for instance. Its basic structure is disclosed, for example, in "A FET-controlled Thyristor in SIPOS Technology", IEDM, 1980 at p. 79. According to the thyristor disclosed therein, a metal oxide semiconductor (MOS) transistor is added and functions as a switching transistor for controlling to drive the turn-on of the thyristor. The MOS transistor has a part of the surface region of a second base layer as a channel region, a second emitter layer as a source, and a first base layer as a drain. It is reported that the "di/dt rating" of this thyristor was remarkably improved up to approx. 4000 amperes/microsecond.

Recently, more requirements have been requested for thyristors: the utility of the thyristors as switching elements for processing larger currents requires much larger di/dt rating for the thyristors. Furthermore, improvements in switching characteristics of the thyristors are strongly desired in the high frequency range. According to conventional thyristors, if a first base layer is enlarged in size so as to increase di/dt rating, energy loss at the turn-on time thereof is increased to thereby cause the high frequency characteristics of the thyristor to be deteriorated.

A MOS gate turn-off thyristor (also known as "MOS-GTO thyristor") improved in its turn-off capability by adding an insulated gate as a second gate for driving the turn-off is disclosed, for example, in "MOS GTO—a Turn-off Thyristor with MOS-controlled Emitter Shorts", IEDM, 1985 at page 158. According to this thyristor, a second gate electrode for controlling the turn-off of the thyristor is insulatively provided above a second base layer. When the turn-off voltage (here, positive voltage) is applied to the second gate electrode, a second emitter layer is electrically shorted to the second base layer through a second channel region, which is disposed directly under the second gate in the second base layer, thus turning off the GTO thyristor. In such a structure, however, only one of first and second channel regions defined in the thyristor, i.e., only the second channel region contributes to drive the turn-off of the thyristor. Therefore, a shorting resistance increases twice as large as the turn-off drive of the thyristor in both channel regions, and a peak turn-off current is reduced approx. in half. This means that the turn-off capability of the thyristor is poor and its turn-off switching speed is improper.

A MOS gate turn-off thyristor (also known as "MOS controlled thyristor") in which a MOSFET is contained to control the turn-off is disclosed, for example, in "MOS Controlled Thyristors (MCT's)", IEDM, 1984 at page 282. According to this conventional thyristor, turn-off channel regions are defined at both sides of a second emitter layer. However, the turn-off channel region in contact with the turn-on channel region almost does not contribute to the turn-off of the thyristor. This occurs because that surface of the second base of the thyristor in which the turn-off channel region and the turn-on channel region are contacted with one another is set to a relatively high resistance, thus disabling turn-on current. Therefore, the thyristor of this type cannot expect rapid turn-on current and uniform cessation, thus reducing the turn-off capacity.

SUMMARY OF THE INVENTION

It is therefore an object of the present invention to provide a new and improved thyristor device which has excellent switching characteristics.

It is another object of the invention to provide a new and improved driving technique for a thyristor in which the flow of a turn-on current and/or the uniform cessation of turn-off current are executed rapidly, thus improving the switching characteristics of the thyristor.

In accordance with the above objects, the present invention is addressed to a specific turn-on/off driving technique for an insulated gate thyristor containing a voltage-controlled switching transistor. The thyristor comprises a first emitter layer, a first base layer, a second base layer, a second emitter layer, a first gate electrode insulatively provided above the first base layer and functioning as the gate of the transistor, and a second gate electrode formed on the second base layer. In order to turn-on drive the thyristor, a voltage for rendering the transistor conductive is applied to the first gate electrode, while substantially simultaneously, a voltage for producing forward biasing between the second base layer and the second emitter layer to expedite the turn-on operation of the thyristor is applied to the second gate electrode.

In order to turn-off the thyristor, a voltage for producing reverse biasing between the second emitter layer and the second base layer to stop the operation of the thyristor is applied to the second gate electrode, while rendering the transistor conductive by applying a voltage to the first gate electrode. While the transistor is kept conductive, charge carriers are specifically allowed to flow from the second emitter layer into the first base layer through the transistor, thereby suppressing the local concentration of the turn-off current in the thyristor. The transistor is rendered nonconductive only after a predetermined time is elapsed from the application of the voltage to the second gate electrode.

In the thyristor, a heavily doped semiconductor layer, which has the same conductivity type as that of the second base layer, is preferably formed in the second base layer to electrically contact directly with the second gate electrode. As a result, the surface region of the second base layer disposed between the second emitter layer and the second gate electrode has an impurity concentration lower than the other region of the second base layer. Thus, the breakdown voltage level between the second base layer and the second emitter layer is raised. This contributes to attain the aforementioned objects of the invention.

The present invention and its objects and advantages will become more apparent from detailed description of preferred embodiments presented hereinafter.

BRIEF DESCRIPTION OF THE DRAWINGS

In the detailed description of a preferred embodiments of the invention presented below, reference is made to the accompanying drawings of which:

FIG. 7 is a graph showing the turn-off capacity of the thyristor of FIG. 5 in comparison with a conventional example, wherein its abscissa axis is lateral resistance of the second base layer directly under the second emitter layer (arbitrary in scale) and its ordinate axis is the maximum turn-off current (arbitrary in scale);

FIG. 8 is a diagram showing a sectional view of a modified example of the thyristor of FIG. 5;

FIGS. 10 to 13 are respective sectional views of other modified embodiments of the thyristor of FIG. 5;

FIG. 14 is a sectional view of an essential portion of a MOS gate GTO thyristor having a double gate structure according to the second embodiment of the invention;

FIG. 15 is a signal waveform diagram showing in a common time scale voltage signals applied to the first and second gate electrodes of the thyristor of FIG. 14 (which may be used to drive the turn-off of the thyristor of FIG. 1) and the timing changes of the anode voltage and the anode current of the thyristor;

FIG. 16 is a signal waveform diagram in a common time scale voltage signals applied to the first and second gate electrodes of the thyristor of FIG. 14 (which may be also used to drive turn-off of the thyristor of FIG. 1) and the time change of the anode voltage and the anode current of the thyristor.

DETAILED DESCRIPTION OF THE PREFERRED EMBODIMENTS

Figure 1:
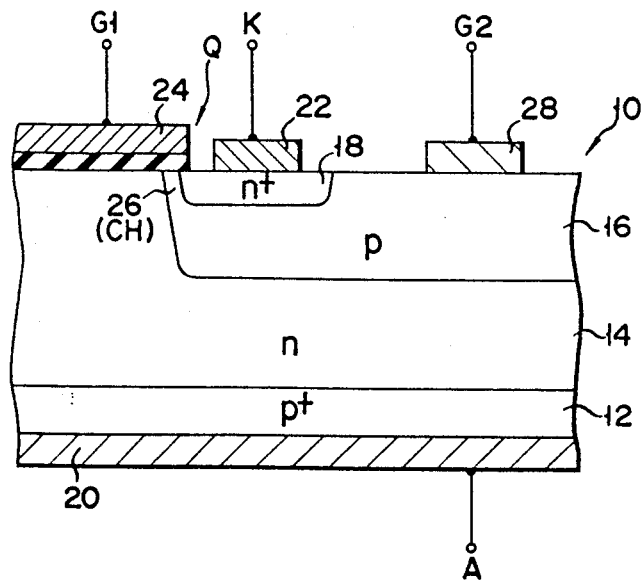
FIG. 1 is a diagram schematically showing a sectional view of an essential portion of an MOS gate GTO thyristor having a double gate structure according to a preferred embodiment of the present invention.

Referring now to FIG. 1, a MOS gate thyristor of a first embodiment of the present invention is generally designated by reference numeral "10". MOS thyristor 10 has heavily doped p type (hereinafter referred to as a "p+ type" according to the customs in the technical art) semiconductive layer 12 as a first emitter layer. n type semiconductive layer 14 is formed in contact with first emitter layer 12. Layer 14 functions as a first base layer. Semiconductive layer 16 of the opposite conductivity type to layer 14, i.e., p type, is formed as a second base layer of the thyristor in one surface region of first base layer 14. n+ type semiconductive layer 18 which functions as a second emitter layer is formed near one end of second base layer 16, thus obtaining p-n-p-n junction structure of the thyristor.

First main electrode 20 (hereinafter referred to as an "anode electrode") is formed on the surface of first emitter layer 12, whereas second main electrode 22 (hereinafter referred to as a "cathode electrode") is formed on the surface of second emitter layer 18. First gate electrode 24 is insulatively provided above first base layer 14 so as to cover surface portion 26 of second base layer 16 interposed between first base layer 14 and second emitter layer 18. Surface 26 of second base layer 16 functions as channel region CH of metal oxide semiconductor (MOS) transistor Q having second emitter layer 18 as a source, first base layer 14 as a drain, and electrode 24 as a gate G1.

Second gate electrode 28 is so formed on second base layer 16 as to be electrically connected directly to second base layer 16. The impurity concentration in the surface region of second base layer 16 is set to approx. $10^{16}$ to $10^{17}/cm^3$ by considering the use of the surface region as channel region CH.

The turn-on driving technique for MOS thyristor 10 having a double gate structure described above will be described in detail. When MOS thyristor 10 is controlled to be turned on, a positive voltage (referred to as a "turn-on driving voltage") is applied to first gate electrode G1, and MOSFET Q is rendered conductive. A voltage (referred to as a "forward bias voltage") for forwardly biasing between second base layer 16 and second emitter layer 18 is substantially simultaneously applied to second gate electrode G2. The applications of the turn-on driving voltage to first gate electrode G1 and of the forward bias voltage to second gate electrode G2 are not always necessarily simultaneously executed: the application of the forward bias voltage to second gate electrode G2 may be modified to be executed before or after the application of the turn-on driving voltage to first gate electrode G1. MOS thyristor 10 is turn-off driven by applying a voltage for reversely biasing between second gate layer 16 and second emitter layer 18 (hereinafter referred to as a "reverse bias voltage") to second gate electrode G2, thus removing charge carriers from second base layer 16 and hence turn-off the current.

Figure 2:
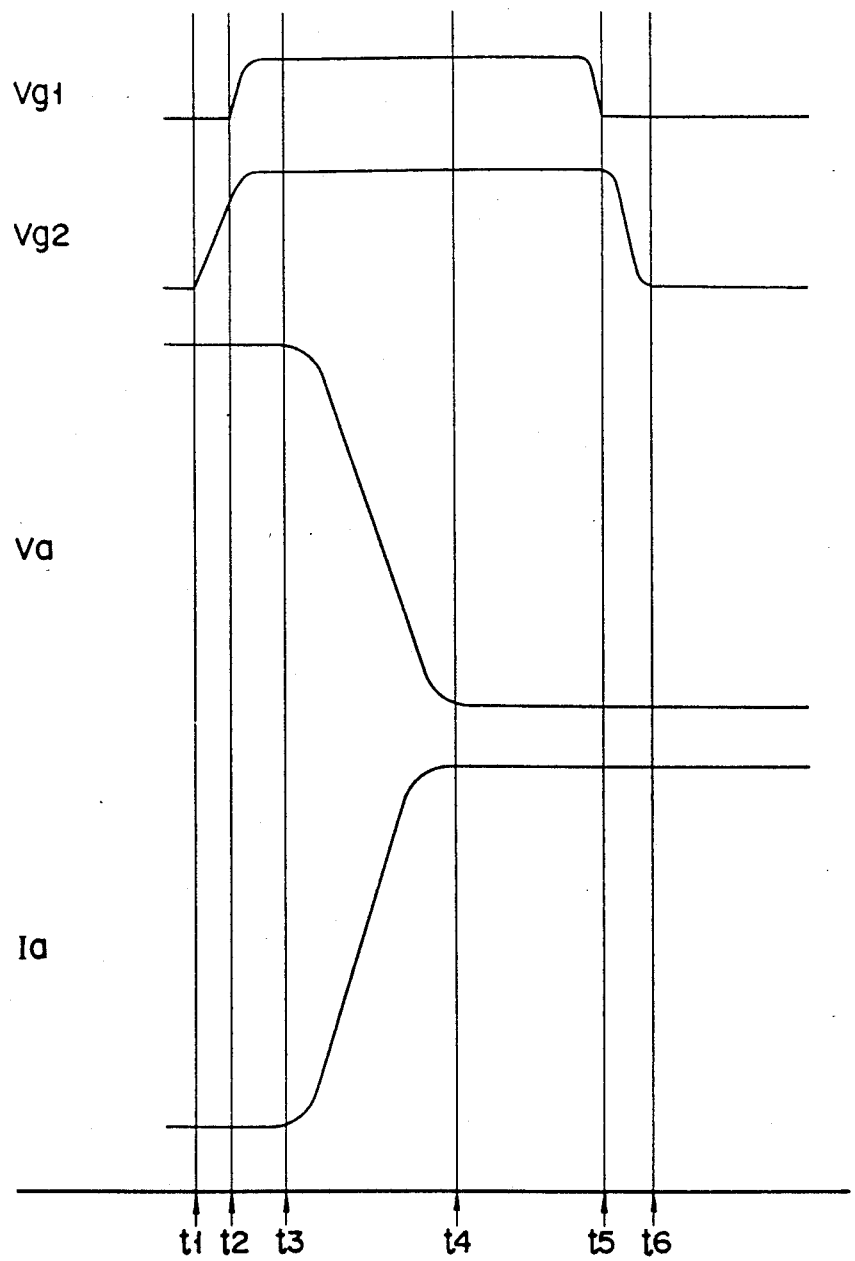
FIG. 2 is a signal waveform diagram showing in a common time scale main voltage signals (which may be used to drive turn-on of the thyristor of FIG. 1) to be applied to the first and second gate electrodes of the thyristor of FIG. 1 and timing changes of the anode voltage and anode current of the thyristor.

The thyristor of the embodiment described above is featured in the turn-on driving technique. The turn on driving technique will be described in more detail by referring to the signal waveform diagram of FIG. 2. FIG. 2 is a graph showing timing changes of turn-on driving voltage $V_{g1}$ for rendering MOSFET Q applied to first gate electrode G1 conductive, forward bias voltage $V_{g2}$ to be applied to second gate electrode G2, anode voltage Va of the thyristor when gate voltages $V_{g1}$ and $V_{g2}$ are applied to the thyristor, and anode current Ia.

When the MOS thyristor is turn-on driven, gate voltage $V_{g2}$ (positive bias) higher by approx. 1.0 volt than cathode potential A is first applied to second gate electrode G2 at time t1. Carriers (electrons, in this case) are injected from second emitter layer 18 to second base layer 16 in response to the application of voltage $V_{g2}$. The injected electrons start traveling toward first base layer 14. When a positive voltage of approx. 5 to 10 volts is applied as the "turn-on driving voltage" to first gate electrode G1 at time t2, MOSFET Q is rendered conductive. The electrons in second emitter layer 18 are accordingly injected through channel region CH of MOSFET to first base layer 14. Holes are injected from first emitter layer 12 to first base layer 14 by the flow of the electrons. Thus, thyristor 10 starts turn-on operating from time t3, and completely becomes turn-on state at time t4 (at which anode voltage Va of thyristor 10 is saturated to the lowest level). Thereafter, even if gate voltages $V_{g1}$ and $V_{g2}$ are returned to zero, thyristor 10 continues the turn-on state.

When the above-mentioned turn-on driving technique is employed, thyristor 10 is turn-on driven by using both first and second gate electrodes G1 and G2. The flow of the turn-on current in second base layer 16 is made uniform, thus preventing local concentration of the turn-on current to the minimum limit. As a result, the di/dt rating of thyristor 10 can be improved, and the turn-on operation can be accelerated to the maximum limit. Therefore, the large current characteristic and the switching characteristics of the thyristor can be improved. In the trial examples manufactured by the present inventors, it was confirmed that the di/dt rating of the thyristor was raised to 6000 amperes/microsecond, and the switching frequency was simultaneously improved up to 1 kilohertz.

Figure 3:
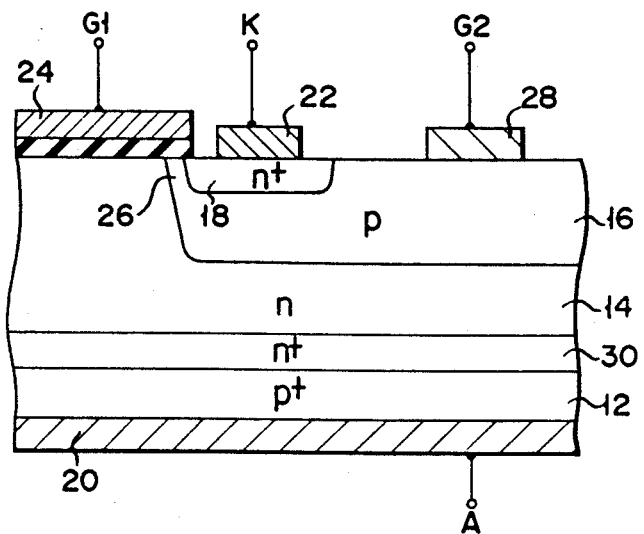
FIGS. 3 and 4 are respective sectional views of modified examples of the thyristor of FIG. 1.
Figure 4:
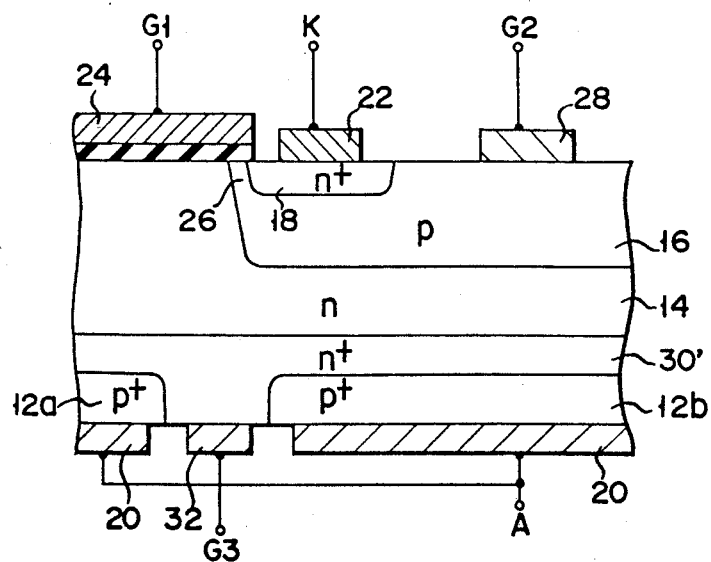

FIGS. 3 and 4 show modified embodiments of thyristor 10 of FIG. 1. In the thyristor of FIG. 3, heavily doped n type (n+ type) semiconductor buffer layer 30 is provided additionally between first base layer 14 and first emitter layer 12. n+ buffer layer 30 has a sheet resistance of 10 to 100 ohms/ . In this structure, the thickness of first base layer 14 can be reduced by half of the thyristor of FIG. 1. When employing the turn-on driving technique of the invention in the thyristor of this structure, the traveling velocity of carriers is accelerated in the thin portion of first base layer 14. This contributes to the improvements in the di/dt rating and high speed switching of the thyristor.

In a modified embodiment of FIG. 3, n+ type buffer layer 30 is so formed to have a "T"-shaped section as to be partly exposed on the anode surface region. First emitter layer 12 is divided into two portions 12a and 12b by "T"-shaped buffer layer 30. Third gate electrode 32 is formed on the exposed surface of T-shaped buffer layer 30, as shown in FIG. 4. When turn-on driving the thyristor having this structure, a negative voltage for forwardly biasing between first emitter layer 12 and first base layer 14 is applied to third gate electrode G3 substantially simultaneously with or before or after the voltage application to first and second gate electrodes G1 and G2. The additional application of the negative voltage to third gate electrode G3 accelerates the injection of holes from first emitter layer 12 to first base layer 14 at thyristor turn-on time, thus further improving the di/dt rating and the high speed switching characteristic of the thyristor. It was confirmed that the di/dt rating (di/dt capability) was raised to approx. 10000 amperes/microsecond, and the switching frequency was simultaneously improved to 5 kilohertz.

Figure 5:
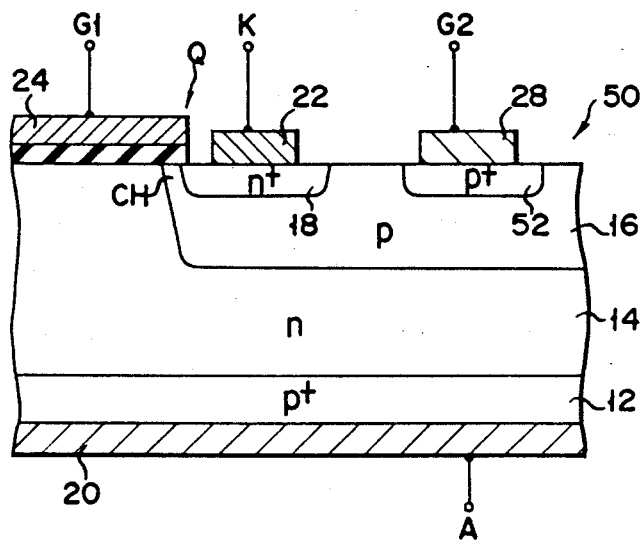
FIG. 5 is a sectional view of an essential portion of a MOS gate GTO thyristor having a double gate structure according to a second embodiment of the present invention.

Thyristor 50 of a second embodiment of the present invention shown in FIG. 5 is featured in that heavily-doped semiconductor layer 52 of the same conductivity type as second base layer 16, i.e., p type, is formed in the surface of second base layer 16 in contact with second gate electrode G2. This p+ layer 52 functions as part of second base layer 16. In other words, the impurity concentration of the surface region disposed between n+ layer 18 and p+ layer 52 is relatively lower. The other constitution of thyristor 50 is similar to thyristor 10 shown in FIG. 1, the same reference numerals are designated, and detailed description will be omitted for the simplification of description.

In order to turn-on drive MOS thyristor 50 constructed as described above, the above-mentioned technique may be employed. In order to turn-on drive the thyristor 50, a positive voltage relative to cathode electrode K is applied to first gate electrode G1, and positive voltage relative to cathode electrode K is applied to second gate electrode G2. The application of the positive voltage to second gate electrode G2 cannot be only executed substantially simultaneously with that of positive voltage to first gate electrode G1, but may be shifted to before or after the application of the positive voltage to first gate electrode G1.

Figure 6:
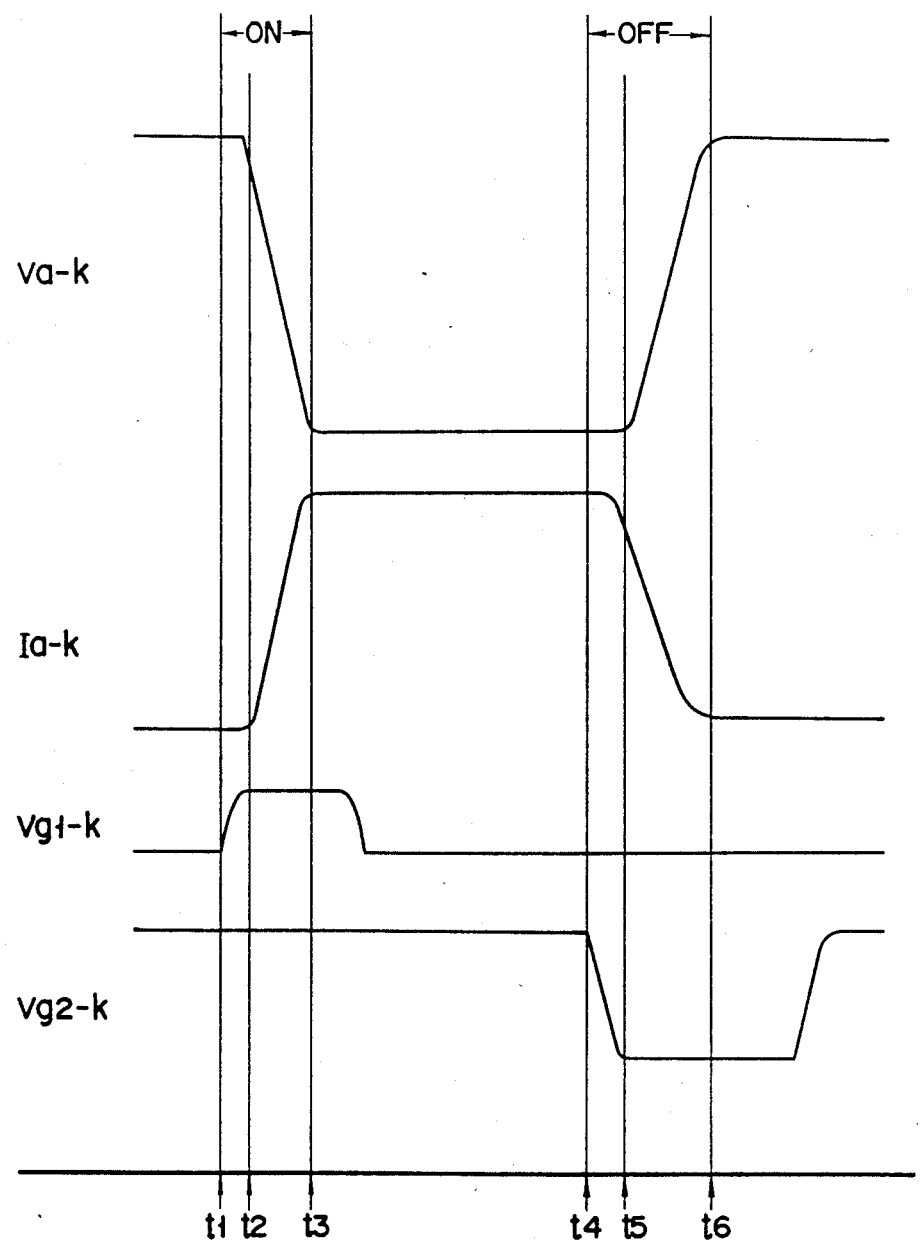
FIG. 6 is a signal waveform diagram showing in a common time scale main voltage signals (which may be used to drive turn-on/off of the thyristor of FIG. 1) to be applied to the essential portions of the thyristor of FIG. 5 and timing changes of the voltage between the anode and the cathode of the thyristor.

The turn-on/off drive of thyristor 50 will be described in more detail with reference to signal waveform diagram of FIG. 6, which shows, in common time scale, voltage Va-k between an anode and a cathode, current Ia-k between the anode and the cathode, voltage $V_{g1-k}$ between first gate electrode G and cathode, and timing changes of voltage $V_{g2-k}$ between second gate electrode G2 and cathode. When a voltage of positive polarity (turn-on driving voltage) relative to cathode electrode K is applied to first gate electrode G1, an inversion layer is formed in channel region CH, and MOSFET Q for turn-on control is triggered. MOS thyristor 50 therefore starts turning-on at time t2. At this time, anode-cathode voltage Va-k of thyristor 50 abruptly starts lowering, and anode-cathode current Ia-k starts abruptly lowering. The turn-on operation is completed at time t3 when anode-cathode voltage Va-k is minimized and anode-cathode current Ia-k is maximized. In this case, second gate electrode G2 was not used to turn on the thyristor.

When a voltage of negative polarity with respect to cathode electrode K (turn-off driving voltage) is applied to second gate electrode G2 at time t4, charge carriers stored in second base layer 16 are forcibly extracted from second gate electrode G2. As a result, the turn-off operation of thyristor 50 is completed from time t5 to time t6.

In the MOS gate type thyristor of this embodiment, charge carriers are forcibly extracted by producing reverse biasing directly between second base layer 16 and second emitter layer 18 by applying suitable voltage to second gate electrode G2, unlike the conventional examples described in the introductory part of the specification for extracting charge carriers by utilizing the channel region defined in the surface portion of the second base layer. Accordingly, even if the lateral resistance of the second base layer and hence the lateral resistance of the region directly under the second emitter layer is relatively large, the turn-off capacity of thyristor 50 is improved.

FIG. 7 is a graph comparing the turn-off capacity of thyristor 50 of this embodiment with that of conventional example, wherein abscissa axis of this indicates the lateral resistance of the region of second base layer 16 directly under second emitter layer 18 (arbitrary in scale), and the ordinate axis indicates maximum turn-off current. Line 56 shows the maximum turn-off current characteristics of the embodiment of the invention, and line 58 indicates the maximum turnoff current characteristic of the conventional example. As apparent from the qualitative comparison graph, thyristor 50 of this embodiment described above exhibits the same lateral resistance of second base layer 16 and turn-off capability approx. three times as large as that of the conventional example. In other words, the maximum turn-off current is improved substantially three times as large as the conventional example, and the turn-off blocking breakdown of the thyristor is raised in response to the improvement. Alternatively, if the maximum turn-off current level is the same degree as that of the conventional example, the lateral resistance of second base layer 16 is allowed to be sufficiently higher than the conventional example. The on-state voltage of the thyristor can also be enhanced, since a wide second emitter area can be realized. The turn-on capability of the thyristor can be improved.

Further, according to the embodiment described above, heavily-doped p (p+) type layer 52 is formed in the surface region formed with second gate electrode G2 of second base layer 16 thereon to increase a resistance between p+ type layer 52 and second emitter layer 18. The reverse blocking voltage between the gate and the cathode can be desirably raised by increasing the resistance between layers 52 and 18.

Various modified examples of the embodiment of FIG. 5 will be described hereinafter. In the thyristor shown in FIG. 8, second base layer 16 has lightly-doped p type (p−) semiconductive surface region 60a surrounding second emitter layer 18, heavily-doped p type (p+) semiconductive surface region 60b adjacent to surface region 60a, and bottom region 60c which is contact with regions 60a and 60b in the bottom portion thereof. p-type semiconductive surface region 60a has, in this embodiment, an impurity concentration of approx. $1 \times 10^{16}/cm^3$ to $2 \times 10^{17}/cm^3$. Bottom region 60c of second base layer 16 has an impurity concentration of approx. $2 \times 10^{18}/cm^3$. Channel region CH of MOSFET Q is defined in p-type region 60a.

Figure 9:
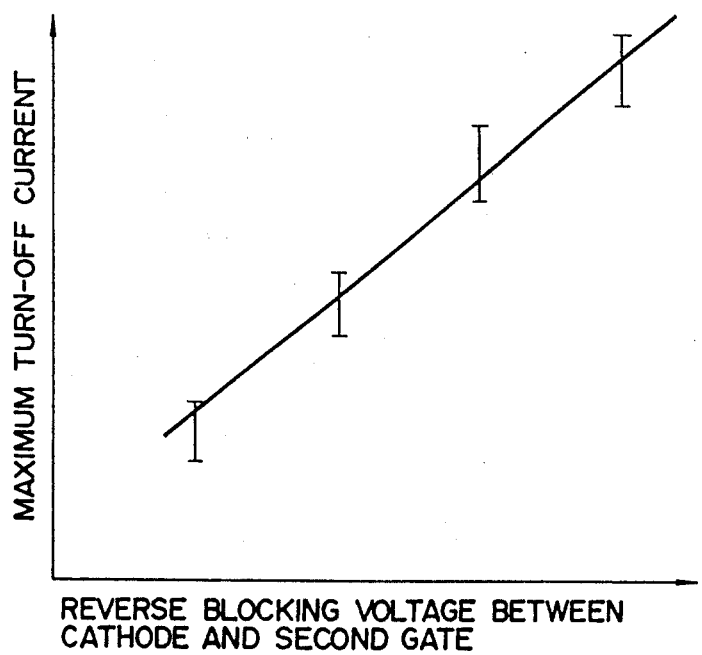
FIG. 9 is a graph showing the relationship reverse blocking voltage between the cathode electrode and the second gate electrode of the thyristor of FIG. 8 and the maximum turn-off current.

According to the thyristor structure described above, the resistance of the region directly under second emitter layer 18 of second base layer 16 can be set to a low value, thus further improving the turn-off capacity of the thyristor. Since p− type layer 60a having high resistance is disposed between second gate electrode G2 and cathode K, the reverse blocking voltage therebetween can be further improved. In this example, it was confirmed that the reverse blocking voltage between second gate electrode G2 and cathode K was actually improved to be raised to approx. 50 volts. FIG. 9 is a graph showing the relationship between the reverse blocking voltage between cathode electrode K and second gate electrode G2 of the thyristor, and the maximum turn-off current. With this, when the resistance of p type second base layer 16 is raised to increase the reverse blocking voltage between the cathode and the second gate electrode, it is readily understood that the maximum turn-off current of the thyristor can be increased that much.

Figure 10:
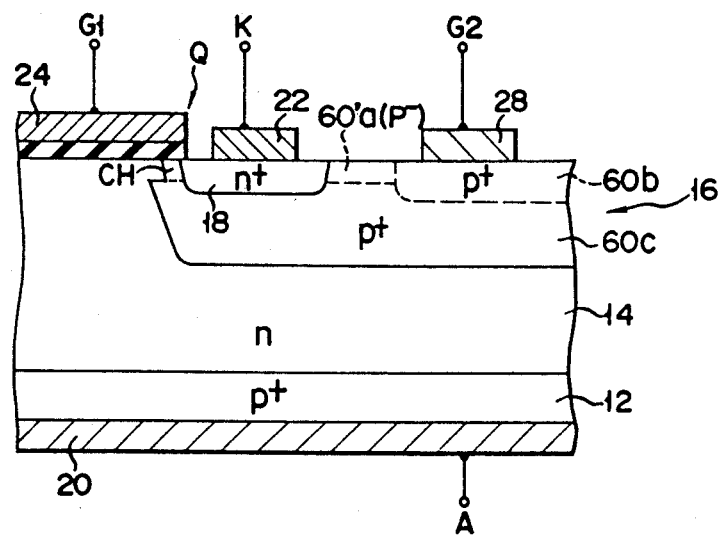

According to another modified embodiment shown in FIG. 10, lightly-doped surface region 60a' of second base layer 16 is formed shallowly, and in direct contact with region 60c through surface region 60a as shown in the bottom of second emitter layer 18. It is to be noted that lightly-doped surface region 60a' is set to p type by considering the conductive type of the channel region of MOSFET Q, and the portion interposed between second emitter layer 18 of surface region 60a' and base surface region 60b may be changed to n type (and hence n-type) as required. Even with this configuration, the reverse blocking voltage between the second gate and the cathode can be maintained large, and the turn-off capacity of the thyristor can be improved.

According to MOS thyristor of still another modification shown in FIG. 11, second base layer 16 has lightly-doped p type (p−) semiconductive surface region 62a surrounding second emitter layer 18 and deep heavily-doped p type (p+) semiconductive surface region 62b adjacent to surface region 62a. p+ type surface region 62b is disposed under second gate electrode G2 of second base layer 16. In this thyristor, the layer corresponding to p+ type bottom region 60c shown in FIGS. 8 and 10 is not formed. Even with this structure, the same advantages as those described above are also provided.

Buffer layer 30 shown in FIG. 3 may be added to the sectional structure of MOS thyristor 50 of FIG. 5, and buffer layer 30 may be preferably deformed to have a "T"-shaped section as in the embodiment shown in FIG. 3. The two sectional structures corresponding to them are shown in FIGS. 12 and 13. More specifically, in the MOS thyristor of FIG. 12, the averaged impurity concentration of n+ type buffer 30 is, for example, $2 \times 10^{16}/cm^3$ or more, and the thickness is 10 micrometers or larger. Thus, the thickness of first base layer 14 having n type can be reduced to (e.g., approx. ⅔) without degrading the forward element voltage by the above-mentioned setting, thus preferably reducing the turn-on starting voltage of the thyristor.

Referring now to FIG. 14, in MOS gate GTO thyristor 100 of third embodiment of the present invention, first base layer 14 has n type semiconductive layer 14a (which functions as a buffer layer) and n− type semiconductive layer 14b laminated with each other. Second base layer 16 is formed in n-type base layer 14b, in which second emitter layer 18 is formed as shown in FIG. 14. A heavily-doped p type (p+) layer is formed in second base layer 16. Since this p+ type layer corresponds to layer 52 in the embodiment in FIG. 5 described above, the same reference numerals as those in FIG. 5 are used even in FIG. 14. Metal layer 22 is formed on second emitter layer 18 to function as cathode electrode K of thyristor 100. Metal layer 24 having opening 102 is so insulatively provided above first base layer 14 as to surround planely cathode electrode K to function as first gate electrode G1 of thyristor 100. Metal layer 28 is formed directly on p+ layer 52 to function as second gate electrode G2 of thyristor 100.

The impurity concentration of the surface region of second base layer 16 is set, for example, to approx. $5 \times 10^{16}$ to $4 \times 10^{17}/cm^3$ by considering the use of part 26 of the surface region as channel region CH of MOSFET Q.

MOS gate GTO thyristor 100 constructed as described above is turn-on driven by applying a voltage necessary to render MOSFET Q conductive to first gate electrode G1. In order to turn-on drive thyristor 100, the turn-on driving technique explained with respect to the above-mentioned embodiments may be employed. When thyristor 100 is turned-off, a voltage sufficient to prevent the thyristor from stopping is applied to second gate electrode G2, while continuously applying a voltage necessary to render MOSFET Q conductive to first gate electrode G1. It should be noted that the nonconduction of MOSFET Q is delayed from the application of turn-off drive of the thyristor to second gate electrode G2 by a predetermined time, so that MOSFET Q is kept conductive at a time when MOS thyristor 100 starts turning-off. This means that, when a current flowing through the second base layer 16 is turned off, a part is allowed to flow from first base layer 18 through channel region CH of MOSFET Q. As a result, the cessation of turn-off current in the device can be averaged to reliably prevent the turn-off current from locally concentrating in the device. Therefore, rapid cessation of large current in thyristor 100 is enabled, thus improving the turn-off capacity.

FIG. 15 shows in a common time scale time changes of gate voltage $V_{g1}$ of first gate electrode G1, gate voltage $V_{g2}$ of second gate electrode G2, anode voltage Va and anode current Ia of thyristor 100. When thyristor 100 is turn-off driven, first gate voltage $V_{g1}$ is set, for example, to 15 volts of positive potential. This potential is sufficient to maintain MOSFET Q conductive. A voltage of negative polarity is applied as reverse bias to cathode electrode K to second gate electrode G2 at time t1. More specifically, second gate voltage $V_{g2}$ is varied from positive potential level to negative potential level at time t1. Anode voltage Va is increased and anode current Ia is decreased in response to the potential change. In other words, the p-n-p-n thyristor starts stopping.

First gate voltage $V_{g1}$ is abruptly dropped to zero at time t2, and MOSFET Q is rendered nonconductive. MOSFET Q is continuously rendered conductive during the period of times t1 and t2 when thyristor 100 is progressively turned-off. Thus, part of the turn-off current is allowed to flow through channel region CH of MOSFET Q. Second gate voltage $V_{g2}$ is changed to further a lower negative potential level in response to the nonconduction of MOSFET Q, thus completely turning off thyristor 100.

The mechanism of the above-mentioned turning-off operation will be described in more detail. When MOS thyristor 100 is subjected to thyristor operation, the flow of electrons from second emitter layer 18 includes a current component extracted through channel region CH of MOSFET Q to first base layer 14, and a current component injected through the p-n junction directly to second base layer 16. When a reverse bias is applied to the p-n junction between second base layer 16 and second emitter layer 18, the injection of the electrons from second emitter layer 18 to second base layer 16 is eliminated, and the electrons are injected only through channel region CH to first base layer 14. When the electrons entering first base layer 14 are extracted to first emitter layer 12, the holes are injected from first emitter layer 12 to first base layer 14. The holes are extracted to second gate electrode G2. At this time, since the thyristor stops operating, the turn-on voltage of the device is increased. When the voltage applied to first gate electrode G1, i.e., first gate voltage $V_{g1}$ is reduced to zero or lower, under the conditions that the turn-on voltage is increased, to render channel region CH of MOSFET Q nonconductive, the injection of the electrons from second emitter layer 18 to first base layer 14 is completely cut off, thus resulting in complete turn-off of thyristor 100.

According to the above-described turn-off driving technique, the flow of the electrons can be subsequently supplied through channel region CH of MOSFET Q, even after the thyristor is stopped by reverse bias between second emitter layer 18 and second base layer 15 by controlling voltage $V_{g2}$ applied to second gate electrode G2 at the turning-off time in MOS gate GTO thyristor 100. Therefore, the distribution of the turn-off current in the device can be uniform. Thereafter, thyristor 100 can be completely turned off by controlling voltage $V_{g1}$ appled to first gate electrode G1.

In the embodiments described above, the off-drive of MOSFET Q has been executed by changing the potential of the gate of MOSFET Q and hence gate electrode G1 to zero or negative. However, MOSFET Q can be rendered nonconductive only by controlling the application of the voltage to second gate electrode G2. An example employing this technique will be described by referring to FIG. 16.

As shown in FIG. 16, second gate voltage $V_{g2}$ is varied from positive to negative at second gate electrode G2 at time t1. The change of second gate voltage $V_{g2}$ itself is similar to that in the previous embodiments. Thyristor 100 starts turning-off in response to the change of second gate voltage $V_{g2}$. The thyristor operation is stopped in the device, the absolute value of the potential of second gate electrode G2 is so changed as to be substantially the same as that of first gate voltage G1 or larger than that at time t2, and first gate voltage $V_{g1}$ is dropped to zero (or negative) at time t3. Thus, the inversion layer of channel region CH of MOSFET Q is substantially erased without changing the gate voltage $V_{g1}$ of first gate electrode G1 to zero, thus rendering MOSFET Q nonconductive. The turn-off driving technique of MOSFET Q utilizes a substrate biasing effect. More specifically, when the absolute value of the gate voltage $V_{g2}$ of second gate electrode G2 is increased to become larger than that of gate voltage V-1 of first gate electrode G1 after the p-n-p-n thyristor section stops operating, the threshold voltage level of MOSFET Q is raised by the so-called "substrate biasing effect". The rise of the threshold value of MOSFET Q enables channel region CH of MOSFET Q to be substantially nonconductive without decreasing the voltage (first gate voltage $V_{g1}$) applied to first gate electrode G1. First gate voltage $V_{g1}$ may be thereafter dropped to zero at a suitable time (time t3 in this example). The distribution of the current becomes uniform during the turn-off operation, because MOSFET Q remains conductive to allow the supply of electron current.

Although the invention has been described with reference to specific embodiments, it shall be understood by those skilled in the art that numerous modification may be made that are within the spirit and scope of the inventive contribution.

Figure 17:
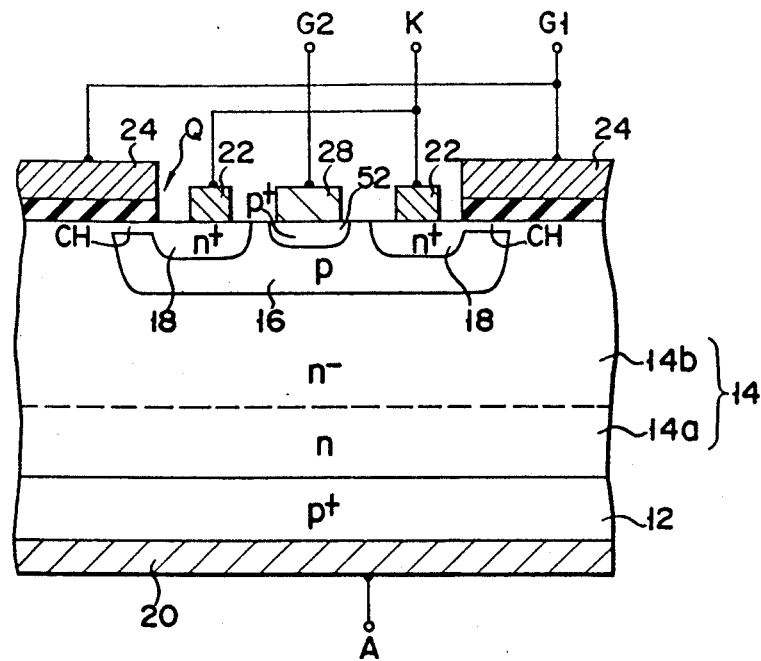
FIG. 17 is a sectional view of a modified example of the thyristor of FIG. 14.

The turn-on/off driving technique of the thyristor of the invention may be separately or simultaneously applied to thyristors of various structures including conventional insulated gate thyristors. For example, the turn-off driving technique of the thyristor according to the present invention described with reference to FIG. 15 or 16 is not only applied to enhancement (normal-off) type MOS thyristor 100 shown in FIG. 14, but applied to depletion (normal-on) type MOS gate GTO thyristor as shown in FIG. 17. This is because the turn-on/off drive of the thyristor is executed by suitably controlling a gate voltage and not due to any essential difference in principle from the turn-off driving of the enhancement type even in the depletion type MOS thyristor.

What is claimed is:

1. An insulated gate thyristor comprising:
   a first emitter layer;
   a first base layer;
   a second emitter layer;
   a second base layer having a bottom section;
   a first gate electrode insulatively provided above said first base layer and a portion of said second base layer positioned between said first base layer and said second emitted layer, said first gate electrode forming a voltagecontrolled switching transistor together with said second emitter layer, said portion of said second base layer which serves as a channel region, and said first base layer;
   a second gate electrode formed on said second base layer;
   said second base layer comprising,
   a first heavily doped region defined in said second base layer so as to be electrically in direct contact with said second gate electrode,
   a lightly doped semiconductor region provided at least in said channel region of said transistor, and
   a second heavily doped region defined at a bottom section of said second base layer to be in contact with said first heavily doped region.

2. The thyristor according to claim 1, wherein said lightly doped region is of the same conductivity type as said heavily doped layer and surrounds at least partially said second emitter layer.

3. The thyristor according to claim 2, further comprising:
   (h) a heavily doped semiconductive buffer layer provided between said first emitter layer and said first base layer and which has the same conductivity type as that of said first base layer.

4. The thyristor according to claim 3, wherein said buffer layer comprises a layer portion partly exposed through said first emitter layer.

5. The thyristor according to claim 4, further comprising:
   (i) a third gate electrode formed directly on a layer portion exposed from said buffer layer.

6. The thyristor according to claim 5, further comprising:
   (j) a first conductive layer formed on said first emitter layer for functioning as a first main electrode of said thyristor; and
   (k) a second conductive layer formed on said second emitter layer for functioning as a second main electrode of said thyristor.

7. The thyristor according to claim 6, wherein said transistor comprises a metal oxide semiconductor field effect transistor.

8. The thyristor according to claim 7, wherein said first main electrode is an anode electrode, and said second main electrode is a cathode electrode.

9. The thyristor according to claim 1, wherein said lightly doped region is in contact with said first heavily doped region in said second base layer.

10. The thyristor according to claim 9, wherein said lightly doped region has a depth greater than said second emitter layer.

11. The thyristor according to claim 10, wherein said second emitter layer is positioned in said lightly doped region so that said lightly doped region surrounds said second emitter layer.

12. The thyristor according to claim 9, wherein said lightly doped region has a depth less than said second emitter layer.

* * * * *